(12) United States Patent
Brady

(10) Patent No.: US 6,841,861 B2
(45) Date of Patent: Jan. 11, 2005

(54) MEMS PACKAGE

(75) Inventor: Frederick T. Brady, San Antonio, TX (US)

(73) Assignees: Sony Corporation, Tokyo (JP); Sony Electronics, Inc., Park Ridge, NJ (US)

( * ) Notice: Subject to any disclaimer, the term of this patent is extended or adjusted under 35 U.S.C. 154(b) by 0 days.

(21) Appl. No.: 10/716,122

(22) Filed: Nov. 18, 2003

(65) Prior Publication Data
US 2004/0099921 A1 May 27, 2004

Related U.S. Application Data

(62) Division of application No. 10/057,368, filed on Jan. 25, 2001, now Pat. No. 6,660,564.

(51) Int. Cl.[7] .............................................. H01L 23/02
(52) U.S. Cl. ........................ 257/678; 257/685; 257/686; 257/257; 257/780
(58) Field of Search ................................ 257/678, 685, 257/686, 780, 784, 692, 711, 723, 737, 779

(56) References Cited

U.S. PATENT DOCUMENTS

| | | | |
|---|---|---|---|
| 5,278,368 A | 1/1994 | Kasano et al. | 200/181 |
| 5,929,498 A | 7/1999 | Ismail et al. | 257/419 |
| 6,124,636 A | 9/2000 | Kusamitsu | 257/728 |
| 6,326,682 B1 | 12/2001 | Kurtz et al. | 257/678 |
| 6,369,931 B1 | 4/2002 | Funk et al. | 359/223 |
| 6,436,853 B2 | 8/2002 | Lin et al. | 438/800 |
| 6,448,109 B1 | 9/2002 | Karpman | 438/108 |
| 6,452,238 B1 | 9/2002 | Orcutt et al. | 257/415 |
| 6,469,909 B2 | 10/2002 | Simmons | 361/803 |
| 6,486,425 B2 | 11/2002 | Seki | 200/181 |
| 6,503,831 B2 | 1/2003 | Speakman | 438/674 |
| 6,506,620 B1 | 1/2003 | Scharf et al. | 438/52 |
| 6,519,075 B2 | 2/2003 | Carr et al. | 359/291 |
| 6,528,351 B1 | 3/2003 | Nathan et al. | 438/118 |
| 6,528,869 B1 | 3/2003 | Glenn et al. | 257/678 |
| 6,548,895 B1 | 4/2003 | Benavides et al. | 257/712 |
| 6,555,417 B2 | 4/2003 | Spooner et al. | 438/113 |
| 6,569,754 B2 * | 5/2003 | Wong et al. | 438/612 |
| 6,574,026 B2 * | 6/2003 | Jin et al. | 359/224 |
| 6,590,267 B1 | 7/2003 | Goodwin-Johansson et al. | 257/415 |
| 6,624,003 B1 * | 9/2003 | Rice | 438/106 |
| 6,661,084 B1 * | 12/2003 | Peterson et al. | 257/680 |
| 6,674,159 B1 * | 1/2004 | Peterson et al. | 257/680 |
| 6,771,859 B2 * | 8/2004 | Carpenter | 385/52 |
| 6,773,962 B2 * | 8/2004 | Saia et al. | 438/118 |
| 6,780,672 B2 * | 8/2004 | Steele et al. | 438/107 |

* cited by examiner

*Primary Examiner*—Michael Lebentritt
(74) *Attorney, Agent, or Firm*—Wood, Herron & Evans, LLP

(57) ABSTRACT

A wafer-level packaging process for MEMS applications, and a MEMS package produced thereby, in which a SOI wafer is bonded to a MEMS wafer and the electrical feed-throughs are made through the SOI wafer. The method includes providing a first substrate having the functional element thereon connected to at least one metal lead, and providing a second SOI substrate having a recessed cavity in a silicon portion thereof with metal connectors formed in the recessed cavity. The non-recessed surfaces of the SOI substrate are bonded to the first substrate to form a hermetically sealed cavity. Within the cavity, the metal leads are bonded to respective metal connectors. Prior to bonding, the recessed cavity has a depth that is greater than the thickness of the functional element and less than the combined thickness of the metal leads and their respective metal connectors. After bonding, silicon from the SOI substrate is removed to expose the buried oxide portion of the SOI substrate. Metal pads are then formed through the SOI substrate to the metal connectors within the cavity. Wire bond pads are thereby connected to the functional element without opening the cavity to the environment. Electrical signals may then be fed through the SOI wafer to the metal connectors, metal leads and the functional element.

20 Claims, 6 Drawing Sheets

MEMS PACKAGE

CROSS REFERENCE TO RELATED APPLICATION

This application is a divisional of U.S. patent application Ser. No. 10/057,368, filed Jan. 25, 2001, now U.S. Pat. No. 6,660,564, and entitled A WAFER-LEVEL THROUGH-WAFER PACKAGING PROCESS FOR MEMS AND MEMS PACKAGE PRODUCED THEREBY, the disclosure of which is incorporated herein by reference in its entirety as if completely set forth herein below.

FIELD OF THE INVENTION

The present invention relates to a wafer-level packaging process for MEMS applications, and more specifically, to a method for putting electrical feed-throughs through an SOI wafer.

BACKGROUND OF THE INVENTION

In microelectromechanical systems (MEMS), the functional element, such as a circuit, sensor or actuator, must often be separated from the environment, yet electrical signals must be sent to and received from the functional element. The functional elements are flexible structures operable within a hermetically sealed cavity. The challenge in packaging MEMS is achieving the electrical connection without opening the cavity to the environment, and to do this with a simple process that results in a small overall footprint and outline. In other words, the MEMS should be fabricated to form a functional element within a hermetically sealed cavity in the semiconductor wafer having an overall structure of small dimension both laterally and vertically.

Past and current attempts to achieve such MEMS include die-level hermetic packaging, but this method produces a device with a large package size at a high cost. Another example is a buried feed-through, but this is a relatively complex process. Still another example is first bonding, then sealing open areas with high temperature LPCVD films, but high temperature processing is not compatible with many metals present on the wafers.

A need thus exists in the semiconductor industry for a method for wafer-level packaging for MEMS applications that allow small footprints, small chip outlines, low-temperature processing, hermetic sealing, and low cost.

SUMMARY OF THE INVENTION

The present invention provides a wafer-level packaging process for MEMS applications in which a SOI (silicon-on-insulator) wafer is bonded to a MEMS wafer and the electrical feed-throughs are achieved through the SOI wafer. The process of the present invention is a simple procedure involving no high temperatures and results in a small, thin device with functional elements hermetically sealed therein. To this end, the method includes providing a first substrate having the functional element thereon connected to at least one metal lead, and providing a second SOI substrate having a recessed cavity in a silicon portion thereof with metal connectors formed in the recessed cavity. The non-recessed surfaces of the second SOI substrate are bonded to the first substrate to form a hermetically sealed cavity. Within the cavity, the metal leads are bonded to respective metal connectors. Prior to bonding, the recessed cavity has a depth that is greater than the thickness of the functional element and less than the combined thickness of the metal leads and their respective metal connectors. After bonding, silicon from the second SOI substrate is removed to expose the buried oxide portion of the second SOI substrate. Metal pads are then formed through the second SOI substrate to the metal connectors within the cavity, such as by etching vias in the substrate and depositing the metal pads within the vias. Wire bond pads are thereby connected to the functional element without opening the cavity to the environment. Electrical signals may then be fed through the SOI wafer to the metal connectors, metal leads and the functional element. In one embodiment of the method of the present invention, an oxide layer is grown on the SOI wafer both on the surface to be bonded to the first substrate and within the recessed cavity to provide electrical isolation between electrical connectors. In yet another embodiment of the method of the present invention, a passivation layer is applied over the buried oxide layer of the SOI substrate and over the metal pads.

BRIEF DESCRIPTION OF THE DRAWINGS

The accompanying drawings, which are incorporated in and constitute a part of this specification, illustrate embodiments of the invention and, together with a general description of the invention given above, and the detailed description given below, serve to explain the invention.

FIGS. 1–9 schematically depict an embodiment of the method of the present invention for packaging a MEMS device, wherein:

FIG. 1 depicts the starting first substrate;

FIG. 2 depicts formation of a functional element and metal leads on the first substrate;

FIG. 3 depicts the starting second SOI substrate;

FIG. 4 depicts the formation of a recessed cavity in a silicon portion of the second SOI substrate;

FIG. 5 depicts the formation of the metal connectors within the recessed cavity;

FIG. 6 depicts the bonding of the first substrate to the second SOI substrate and the bonding of the metal connectors to the metal leads;

FIG. 7 depicts the removal of the second silicon portion of the SOI substrate to expose the buried oxide layer;

FIG. 8 depicts the formation of vias through the SOI wafer to expose the metal connectors within the recessed cavity; and FIG. 9 depicts the formation of the metal pads within the vias for electrical connection to the functional element hermetically sealed within the cavity, and depicts the completed MEMS package produced by the method of FIGS. 1–9.

FIGS. 4A–9A depict an embodiment similar to FIGS. 4–9, but including the formation of an oxide layer on a surface of the silicon portion and within the recessed cavity before the metal connectors are formed, and FIG. 9A further depicts the resulting completed MEMS package.

DETAILED DESCRIPTION

Figure 1:
Figure 2:
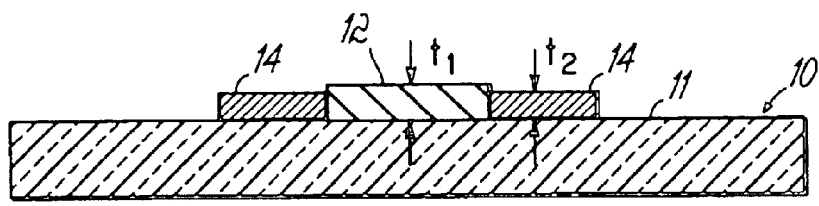

The method of the present invention uses an SOI wafer as wafer-level packaging material, and puts electrical feed-throughs through the SOI wafer. The processing is simple, no high temperature steps are required, and the resulting die is small and thin, and does not require complex packaging to achieve cavity hermeticity. The method will be described with reference to FIGS. 1–9, which schematically depict the method by which a MEMS device is packaged according to the present invention. As depicted in FIG. 1, a first substrate 10 is provided. This wafer or substrate 10 may be any silicon or non-silicon wafer, such as a Pyrex glass wafer. As depicted in FIG. 2, the functional element 12 is formed on the surface 11 of the first substrate 10. The term "functional element" refers to the microelectromechanical device, which may for example be a circuit, sensor or actuator. The method for forming the functional element 12 on the first substrate 10 may be by any method known to one skilled in the art. Once formed, the functional element 12 will have a thickness $t_1$. At least two metal leads 14 are formed on the surface 11 of the first substrate 10, at least one of those metal leads 14 being connected to the functional element 12. In one embodiment of the present invention, shown in FIG. 2, two metal leads 14 are formed and connected to the functional element 12. It should be understood by those skilled in the art that a typical semiconductor device includes a plurality of functional elements 12, each having electrical connections in and out of the functional element 12. The metal leads 14 generally comprise a soft metal, for example aluminum, gold, aluminum alloys, or gold alloys. When formed, the metal leads 14 have a thickness $t_2$.

Figure 3:
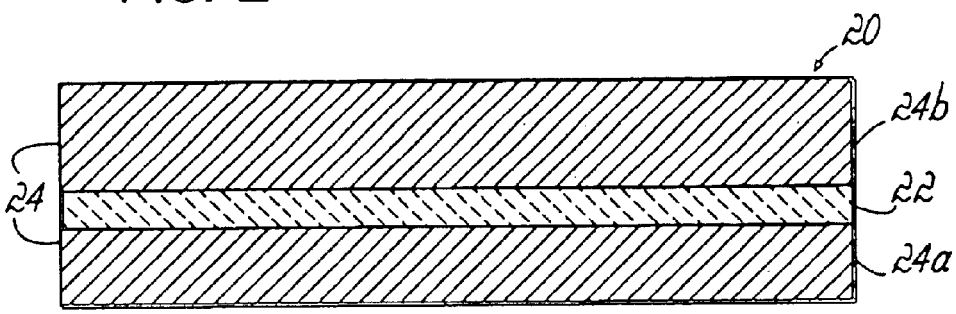

As depicted in FIG. 3, a second substrate 20 is provided, which is a SOI wafer. SOI wafer refers to a silicon-on-insulator in which a thin oxide layer 22 is buried within the silicon substrate 24. To state another way, SOI substrate 20 comprises a first silicon portion 24a, a second silicon portion 24b, and a silicon oxide layer 22 therebetween. SOI wafers are well known in the art of semiconductor devices.

Figure 4:
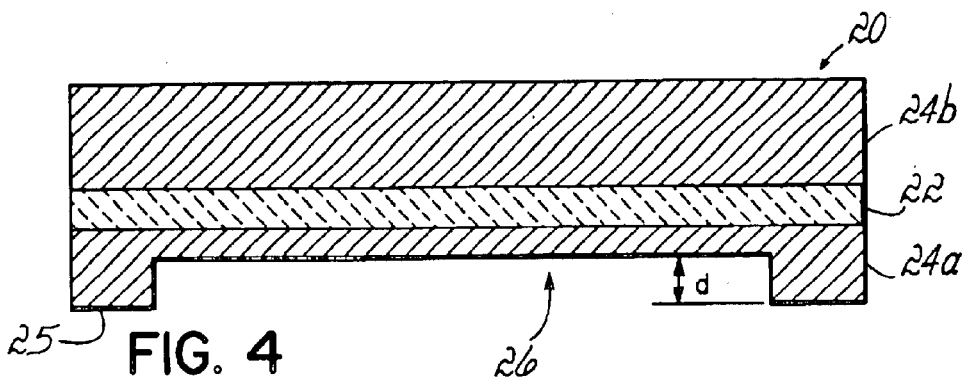
Figure 4A:
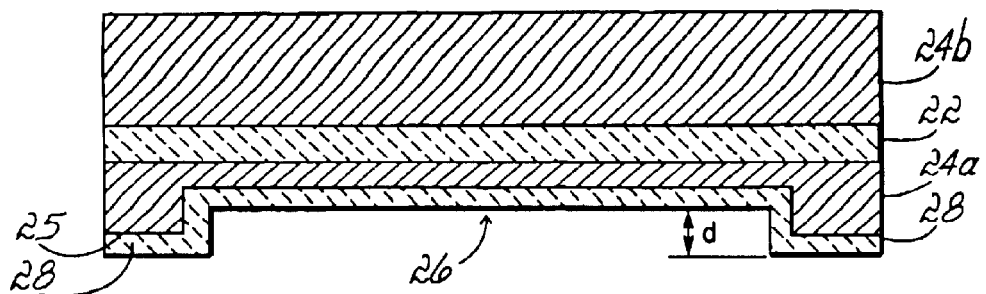

As depicted in FIG. 4, a recessed cavity 26 is formed in the first silicon portion 24a of the second SOI substrate 20. Any known method for material removal may be used in the method of the present invention to form the recessed cavity 26. For example, the recessed cavity 26 may be formed by reactive ion etching (RIE), which may use for example a dry plasma of $SF_6$. By way of further example, wet chemical etching may be used, for example using KOH. The recessed cavity 26 is etched to a depth d greater than the thickness $t_1$ of the functional element 12 formed on the first substrate 10. In another embodiment of the present invention, depicted in FIG. 4A, an oxide layer 28 is grown on the non-recessed surface 25 of the first silicon portion 24a and within the recessed cavity 26. This oxide layer 28 may be grown by any method known to those skilled in the art, such as by thermal oxidation. The oxide layer 28 provides electrical isolation between the electrical connectors. In remaining FIGS. 5–9, the device is shown without the oxide layer 28, and in FIGS. 5A–9A, the device is shown with the oxide layer 28.

Figure 5:
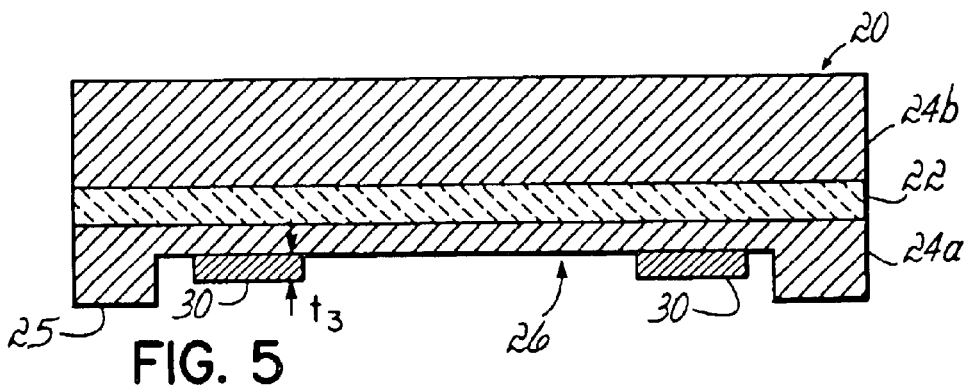
Figure 5A:
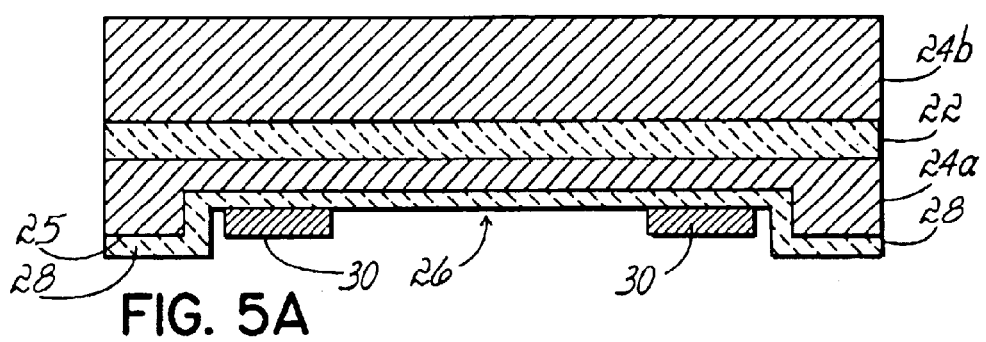

As shown in FIGS. 5 and 5A, metal connectors 30 are formed in the recessed cavity 26. The metal connectors 30 are each positioned to correspond to a respective metal lead 14 formed on the first substrate 10. As with the metal leads 14, the metal connectors 30 may comprise a soft metal, such as aluminum, gold or an alloy of aluminum or gold. Advantageously, the metal connectors 30 comprise the same metal as the metal leads 14. When formed, the metal connectors 30 have a thickness $t_3$. Referring back to FIGS. 4 and 4A, the depth d of the recessed cavity 26 should be less than the combined thickness $t_2+t_3$ of the metal leads 14 and metal connectors 30. The metal connectors 30 may be formed by any method known to those skilled in the art of semiconductor device fabrication.

Figure 6A:
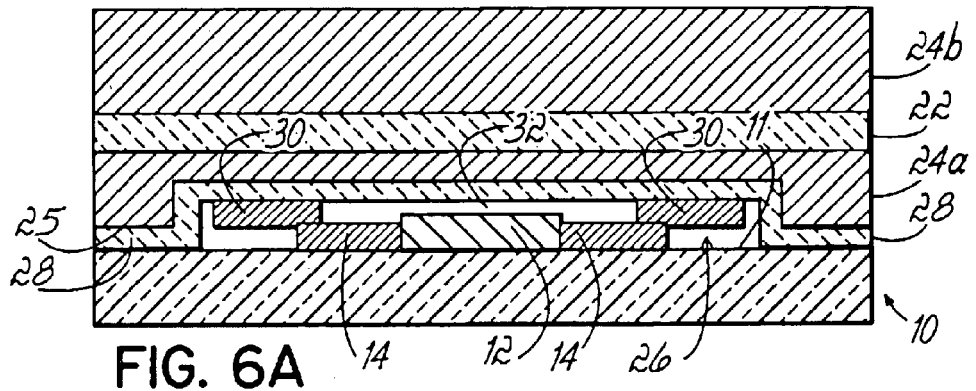
Figure 6:
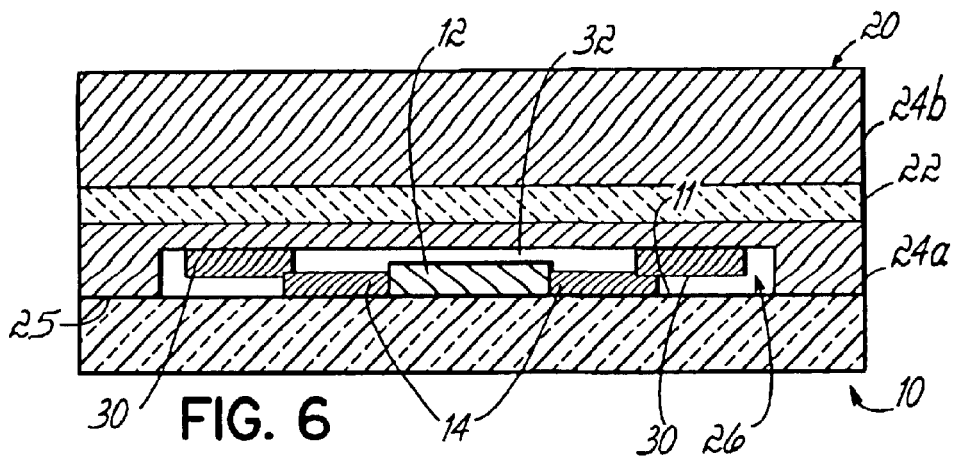

FIG. 6 depicts the bonding of the second SOI substrate 20 to the first substrate 10. The non-recessed surface 25 of the SOI substrate 20 is bonded to the surface 11 of the first substrate 10. The metal leads 14 on the first substrate 10 are generally or partially aligned with the metal connectors 30 formed within the recessed cavity 26 of the second SOI substrate 20. Because the depth d of the recessed cavity 26 is less than the combined thicknesses $t_2$ and $t_3$ of the metal leads 14 and metal connectors 30, a metal lead 14 and respective metal connector 30 are fused together such that the resulting combined thickness is equal to the depth d of the recessed cavity 26. By virtue of the bonding of the non-recessed surface 25 of the second SOI substrate 20 to the first substrate 10, the recessed cavity 26 is hermetically sealed from the environment. A space 32 remains within the sealed recessed cavity 26 above the functional element 12 by virtue of the depth d of the recessed cavity 26 being greater than the thickness $t_1$ of the functional element 12. The functional element 12 is thus enclosed in the hermetically sealed cavity 26 and movable therein. In the embodiment depicted in FIG. 6A, the oxide layer 28 formed on the non-recessed surface 25 of the second SOI substrate 20 is bonded to the first substrate 10. The same effect of a hermetically sealed cavity 26 is achieved in this embodiment.

In exemplary embodiments of the present invention, the bonding of the substrates 10, 20 may be by room temperature fusion bonding or anodic bonding. In room temperature fusion bonding, which is advantageously used when the first substrate 10 is a silicon-base substrate, the wafers 10, 20 are cleaned and then bonded together by applying a pressure in the range of about 800–1400 pounds. The bonded wafers are then cured at room temperature, for example, for a period of a few days. If it is desirable to accelerate the curing of the wafer bond, a low temperature annealing may be utilized, wherein the temperature is less than a temperature that would negatively effect the metal portions of the device, for example around 200° C. Alternatively, the bonding may be anodic bonding, which may be advantageously used where the first substrate 10 is a Pyrex glass or other glass substrate. Anodic bonding generally comprises applying an electrical bias in the range of about 100–1000 V, for example about 800 V to the wafers 10, 20 in contact while applying a temperature in the range of about 300–500° C.

Figure 7A:
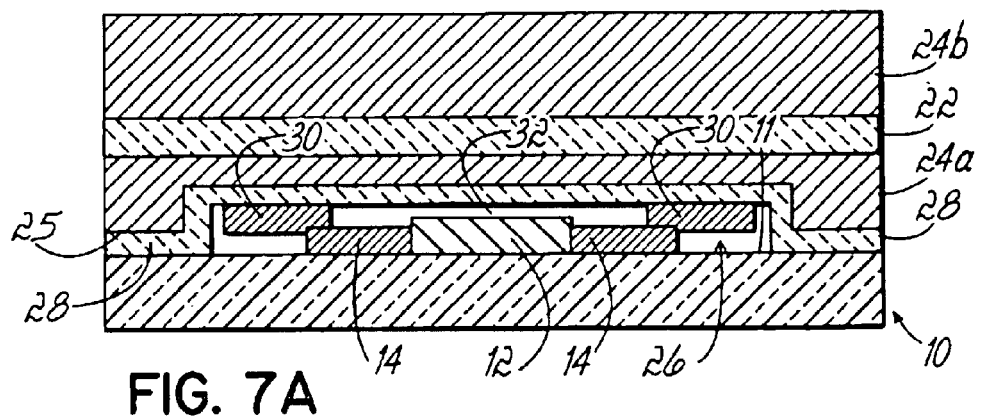
Figure 7:
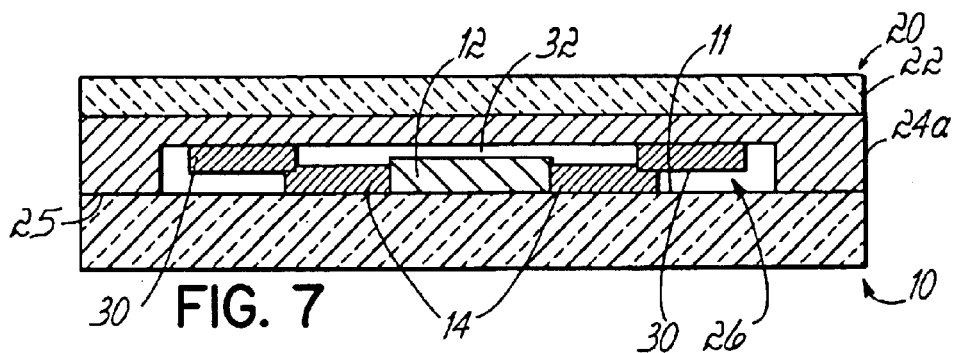

As shown in FIGS. 7 and 7A, the second silicon portion 24b of the second SOI substrate 20 not bonded to the first substrate 10 is removed to expose the buried oxide layer 22. The silicon may be removed by any method known to those skilled in the art, such as the RIE and wet etch methods discussed above with respect to formation of the recessed cavity 26.

Figure 8:
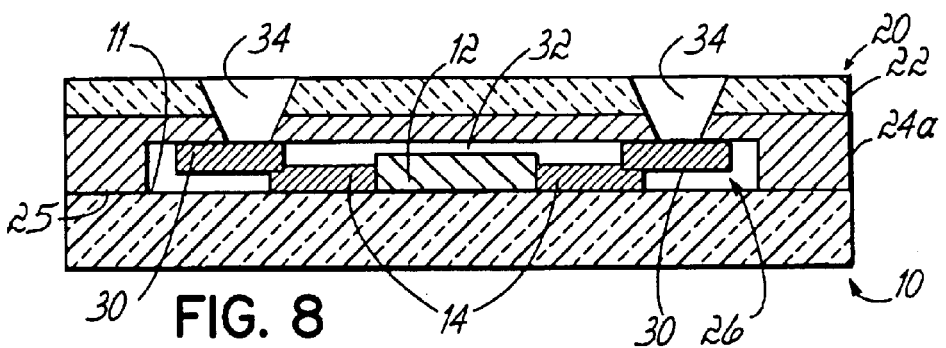
Figure 8A:
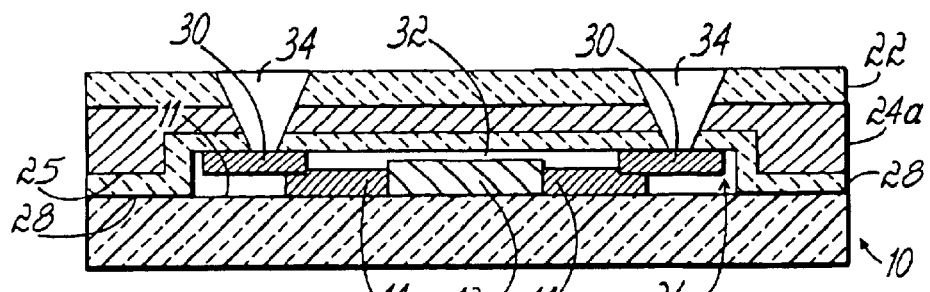

As shown in FIGS. 8 and 8A, vias 34 are formed through the second SOI substrate 20 to expose the metal connectors 30 within the recessed cavity 26. The formation of the vias 34 will allow for electrical connections to be made through the SOI substrate 20 to the metal connectors 30 and metal leads 14, and thus to the functional element 12 sealed within the cavity 26, but does not break the hermetic seal and expose the functional element 12 to the environment. The vias 34 may be etched by any method known to those skilled in the art. For example, the etching of the vias 34 may include a two-step process in which one method is used to etch through the oxide layer 22 of the SOI substrate 20, and a second method is used to etch through the silicon portion 24a of the SOI substrate 20. By way of further example, an HF-containing solution may be used to etch the oxide layer 22, and the wet chemical etching or RIE methods discussed above may be used to etch through the Si layer 24a.

Figure 9:
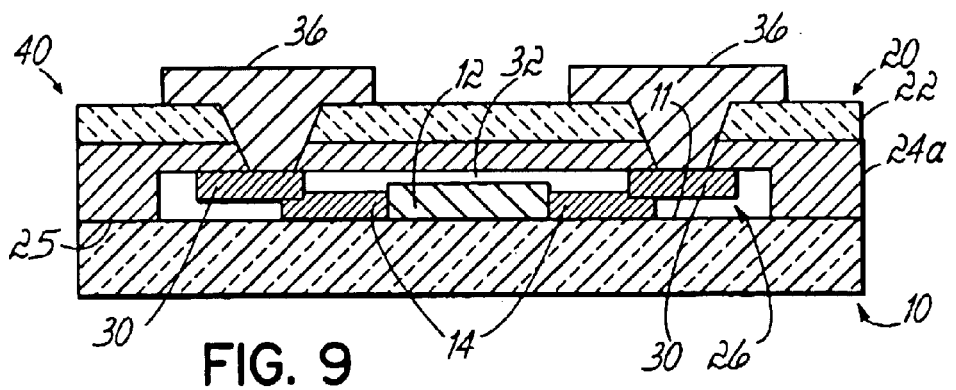
Figure 9A:
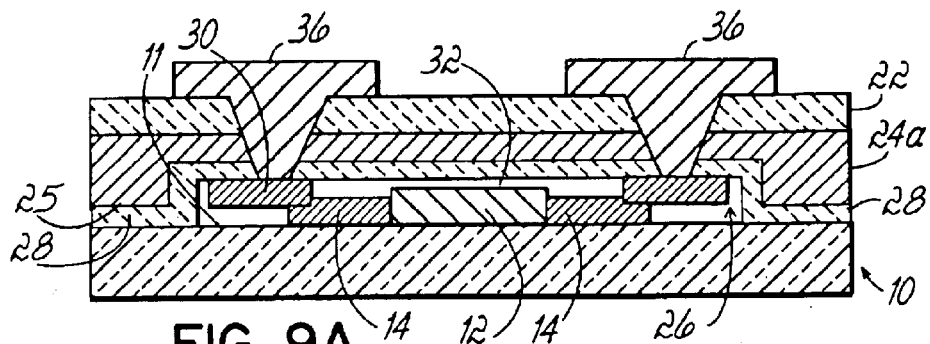

FIGS. 9 and 9A depict the patterning of metal pads 36 for forming electrical connections with the functional element 12. The wire bond pads 36 are formed within the vias 34 on the metal connectors 30 and extend over a portion of the oxide layer 22 of the second SOI substrate 20. The formation of the metal pads 36 may be by any method known to those skilled in the art, and generally includes CVD and PVD methods. By way of further example, the metal pads 36 may be aluminum with a barrier/adhesion liner or may be gold with an adhesion liner. For example, the metal pads may be Al/Ti/TiN or Au/Cr.

There is thus formed a complete MEMS package 40 in which electrical connections are made by the metal pads 36, through the metal connectors 30, through the metal leads 14 to the functional element 12, and vice versa. No complex processing nor high temperatures were required in the above-described process. Moreover, the functional element 12 is electrically connected while being hermetically sealed within the package 40.

Figure 10A:
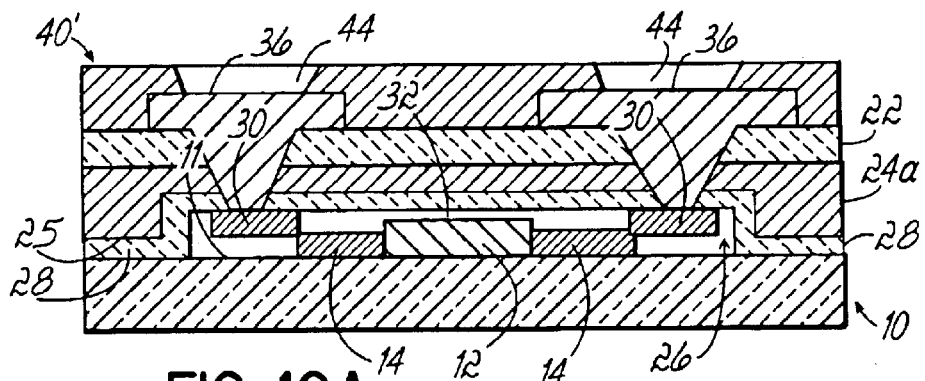
FIGS. 10 and 10A depict embodiments of the present invention including a passivation layer.
Figure 10:
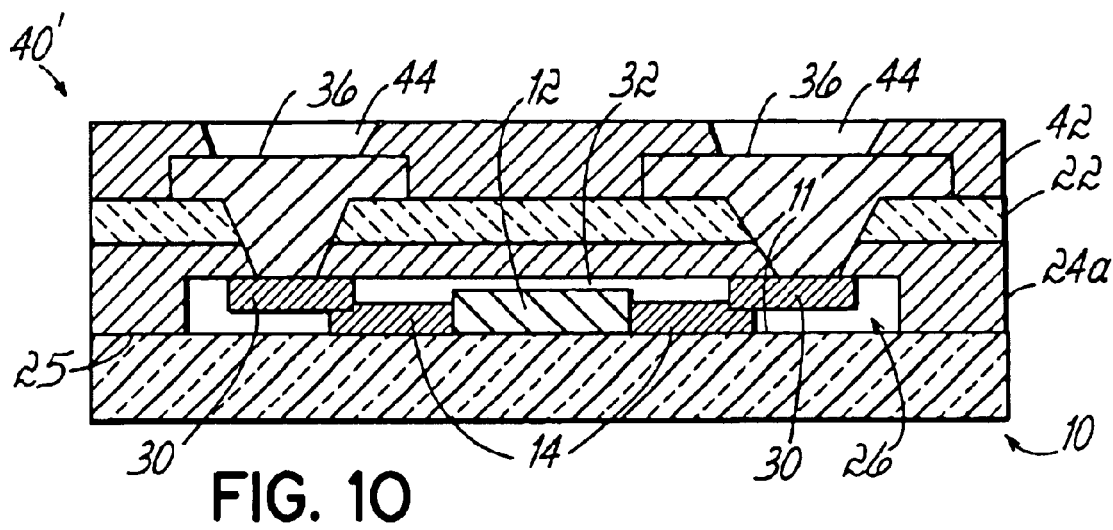

Another embodiment of a method and resulting MEMS package 40' of the present invention is depicted in FIGS. 10 and 10A. The MEMS package 40' may include a passivation layer 42 formed over a portion of the wire bond metal pads 36 and over the exposed oxide portion 22 of the second SOI substrate 20. In this embodiment, vias 44 are formed above at least a portion of the wire bond metal pads 36. The passivation layer 42 provides additional contamination control for the device 40'. By way of example, the final passivation layer 42 is a plasma nitride, and may be formed by blanket PECVD using silane and ammonia. The via or pad openings 44 over the metal pads 36 may be formed by any material removal process known to those skilled in the art.

Figure 11A:
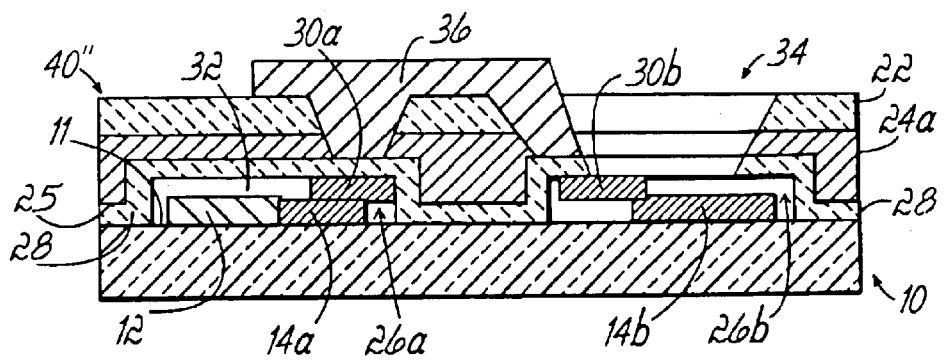
FIGS. 11 and 11A depict embodiments of the present invention including a single wire bond pad connecting a hermetically sealed functional element to a metal lead in another cavity.
Figure 11:
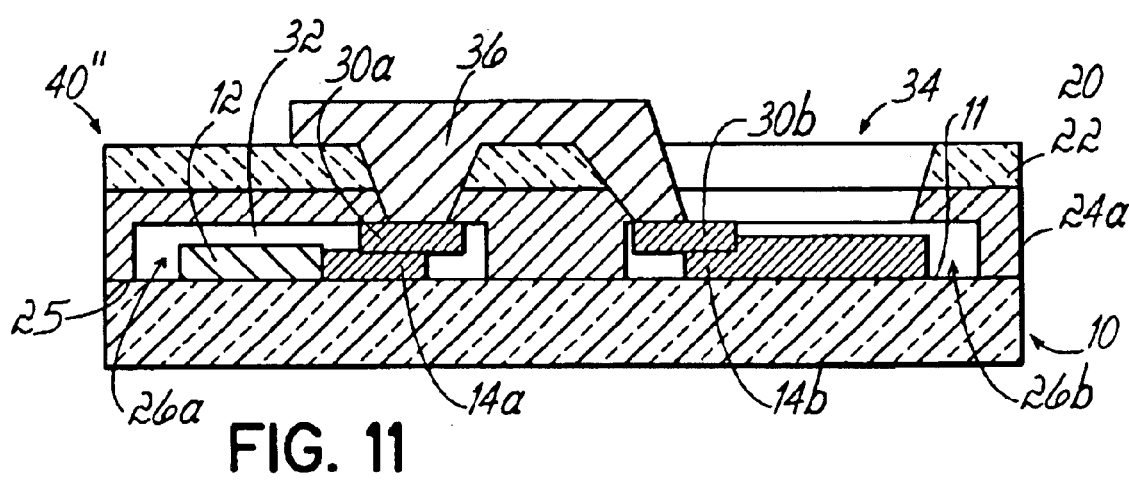

FIGS. 11 and 11A depict yet another embodiment of a method and resulting MEMS package 40" of the present invention. In this embodiment, the functional element 12 and one metal lead 14a and metal connector 30a are enclosed within one recessed cavity 26a, and a second recessed cavity 26b is formed in the second SOI substrate 20 for a second metal lead 14b and metal connector 30b. Vias 34 are formed through oxide layer 22 and silicon portion 24a to each of the metal connectors 30a, 30b. A wire bond pad 36 is formed in the vias 34 in the active SOI substrate 20 and over oxide layer 22 thereby using the top 23 of the oxide 22 as a temporary passage for the metal line.

Figure 12:
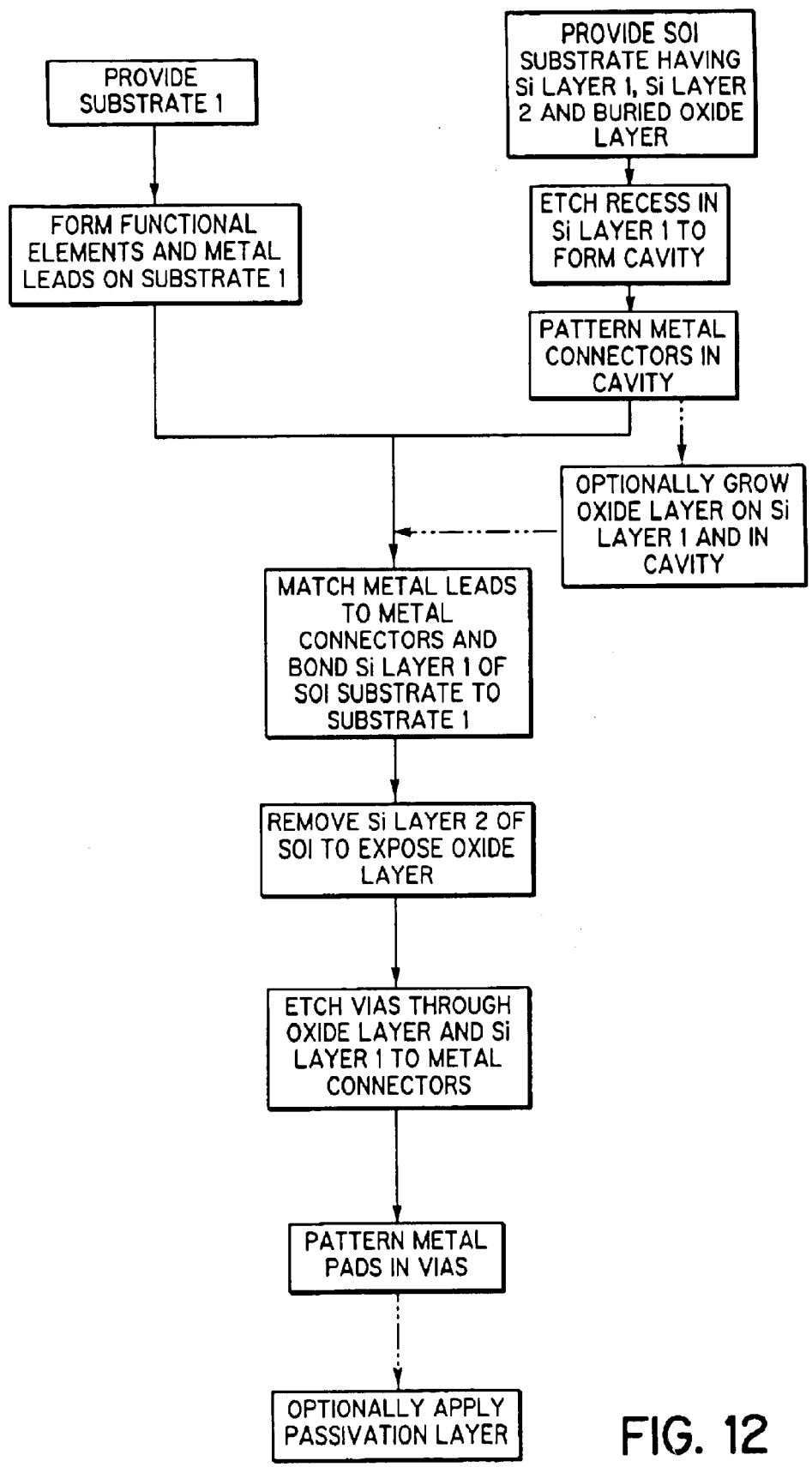
FIG. 12 is a flow chart for methods of the present invention.

FIG. 12 provides a flow chart for an exemplary embodiment of the method of the present invention. To form the non-active substrate, the first step is to provide the first substrate. The next step is to form the functional element or elements and the metal leads on the first substrate. To form the active substrate, the first step is to provide a second SOI substrate having a first silicon layer, a second silicon layer, and a buried oxide layer therebetween. The second step is to then etch a recess in the first silicon layer to form the recessed cavity. The third step is to pattern the metal connectors within that recessed cavity. An optional fourth step may include growing an oxide layer on the first silicon layer and within the recessed cavity. Having formed the first substrate with a functional element and metal leads thereon, and having formed a second SOI substrate having at least one recessed cavity in a silicon portion thereof with metal connectors therein, the two substrates may then be bonded together by generally matching the position of the metal leads to the position of the metal connectors and bonding them together as well as bonding the non-recessed surface of the first silicon layer to the first substrate. Next, the second silicon layer of the SOI substrate is then removed to expose the buried oxide layer. Vias are then etched through the oxide layer and the first silicon layer to expose the metal connectors. Metal pads are then patterned within the vias and at least partially over the oxide layer. Optionally, a final passivation layer may be formed over the metal pads and oxide layer to provide additional contamination resistance. There is thus provided a packaging method for MEMS that allows for a small footprint, small chip outline, low temperature processing, hermetic sealing of the functional element and at a low cost compared to prior techniques.

While the present invention has been illustrated by the description of an embodiment thereof, and while the embodiment has been described in considerable detail, it is not intended to restrict or in any way limit the scope of the appended claims to such detail. Additional advantages and modifications will readily appear to those skilled in the art. The invention in its broader aspects is therefore not limited to the specific details, representative apparatus and method and illustrative examples shown and described. Accordingly, departures may be made from such details without departing from the scope or spirit of applicant's general inventive concept.

What is claimed is:

1. A microelectromechanical package comprising:
   a first substrate having at least one functional element and at least two metal leads thereon, at least one of the two metal leads being connected to the functional element;
   a second substrate having a silicon portion, a silicon oxide portion, at least one recessed cavity in the silicon portion, and at least two metal connectors in the recessed cavity;
   a first bond between a non-recessed surface of the silicon portion of the second substrate and the first substrate wherein the at least one recessed cavity is hermetically sealed thereby, and wherein the functional element and connected metal lead of the first substrate are enclosed within the at least one recessed cavity of the second substrate and hermetically sealed therein;
   a second bond between each of the at least two metal connectors of the second substrate and a respective one of the at least two metal leads of the first substrate; and
   a metal pad connected to each metal connector of the second substrate through the silicon oxide portion and silicon portion.

2. The package of claim 1 wherein the functional element of the first substrate is connected to two of the at least two metal leads of the first substrate, and the functional elements and two connected leads are enclosed within the at least one recessed cavity of the second substrate.

3. The package of claim 1 further comprising a passivation layer overlying the silicon oxide portion of the second substrate and overlying a portion of the metal pad.

4. The package of claim 3 wherein the passivation layer comprises silicon nitride.

5. The package of claim 1 further comprising an oxide layer overlying the non-recessed surface and within the recessed cavity, wherein the first bond is between the oxide layer and the first substrate, and wherein the at least two metal connectors are on the oxide layer within the recessed cavity.

6. The package of claim 1 wherein the first substrate comprises a portion of a silicon base wafer.

7. The package of claim 1 wherein the first substrate comprises a portion of a Pyrex glass base wafer.

8. The package of claim 1 wherein the metal leads and the metal connectors each comprise a metal selected from the group consisting of: aluminum, gold, aluminum alloy, and gold alloy.

9. The package of claim 1 wherein the metal leads and connectors comprise the same metal.

10. The package of claim 1 wherein the metal pads comprise aluminum on a titanium/titanium nitride liner.

11. The package of claim 1 wherein the metal pads comprise gold on a chromium liner.

12. The package of claim 1 wherein the second substrate comprises a plurality of recessed cavities in the silicon portion, each cavity having at least one metal connector therein, the functional element being enclosed and sealed within one of the plurality of cavities, and the metal pads on each of the metal connectors connecting over the oxide portion.

13. The package of claim 12 further comprising a plurality of functional elements, each unique functional element enclosed and sealed within a corresponding unique one of the plurality of cavities.

14. The package of claim 1 wherein the functional element is connected to two metal leads within the recessed cavity.

15. A microelectromechanical package comprising:

a first substrate;

microelectromechanical device positioned on the first substrate;

an electrically conductive lead positioned on the first substrate and electrically coupled to the microelectromechanical device;

a second substrate bonded to the first substrate such that the microelectromechanical device is hermetically sealed within a cavity in the second substrate;

an electrically conductive bonding pad extending through the second substrate; and an electrically conductive connector positioned on the second substrate within the cavity and positioned to form an electrical connection between the bonding pad and the lead.

16. The package of claim 15 further comprising:

an electrically conductive second lead positioned on the first substrate and electrically coupled to the microelectromechanical device;

an electrically conductive second bonding pad extending through the second substrate; and an electrically conductive second connector positioned on the second substrate within the cavity and positioned to form an electrical connection between the second bonding pad and the second lead.

17. The package of claim 15 further comprising:

a second microelectromechanical device positioned on the first substrate and hermetically sealed within a second cavity in the second substrate;

an electrically conductive second lead positioned on the first substrate and electrically coupled to the second microelectromechanical device; and an electrically conductive second connector positioned on the second substrate within the second cavity and positioned to form an electrical connection between the bonding pad and the second lead.

18. The package of claim 15 further comprising an oxide layer between the first and the second substrates.

19. The package of claim 15 wherein the connector is positioned on a surface of an oxide layer.

20. The package of claim 15 further comprising a passivation layer overlying the second substrate.

* * * * *